(12) United States Patent
Barowski et al.

(10) Patent No.: US 9,569,580 B2
(45) Date of Patent: Feb. 14, 2017

(54) INTEGRATED CIRCUIT DESIGN CHANGES USING THROUGH-SILICON VIAS

(71) Applicant: International Business Machines Corporation, Armonk, NY (US)

(72) Inventors: Harry Barowski, Beoblingen (DE); Joachim Keinert, Altdoft (DE); Sridhar H. Rangarajan, Bangalore (IN); Haoxing Ren, Austin, TX (US); Sourav Saha, Kolkata (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/852,707

(22) Filed: Sep. 14, 2015

(65) Prior Publication Data

US 2016/0070842 A1    Mar. 10, 2016

Related U.S. Application Data

(63) Continuation of application No. 14/477,976, filed on Sep. 5, 2014.

(51) Int. Cl.
G06F 17/50 (2006.01)
(52) U.S. Cl.
CPC ................ G06F 17/5077 (2013.01)
(58) Field of Classification Search
CPC ..................................................... G06F 17/50
USPC .......................................................... 716/126
See application file for complete search history.

(56) References Cited

U.S. PATENT DOCUMENTS

| 8,604,593 | B2 | 12/2013 | Schuetz |
| 8,689,164 | B2 | 4/2014 | Balabanov et al. |
| 2010/0060310 | A1 | 3/2010 | Laisne et al. |
| 2010/0320565 | A1 | 12/2010 | Chen et al. |
| 2012/0304142 | A1 | 11/2012 | Morimoto et al. |
| 2014/0149953 | A1 | 5/2014 | Davidovic et al. |
| 2015/0179568 | A1* | 6/2015 | Chang ................ G06F 17/5072 257/774 |

OTHER PUBLICATIONS

Office Action dated Jan. 21, 2016, received in a related U.S. Appl. No. 14/477,976.
Chien et al., "Redundant-Via-Aware ECO Routing," 19th Asia and South Pacific Design Automatin Conference, Jan. 20-23, 2014, pp. 418-423, © 2014 IEEE, D.O.I.: 10.1109/ASPDAC.2014.6742927.

(Continued)

*Primary Examiner* — Thuan Do
(74) *Attorney, Agent, or Firm* — Scully, Scott, Murphy & Presser, P.C.

(57) ABSTRACT

A method for adding an electrical interconnection within a three-dimensional integrated circuit (3-D IC) is disclosed. The method may include creating, within a design file of a 3-D IC that specifies a layout for a first chip of the 3-D IC, design data corresponding to a set of through-silicon via (TSV) reservation areas. The method may also include receiving an engineering change order (ECO) and releasing, in response to the ECO, at least one TSV reservation area for reuse. The method may also include adding, by re-using at least one TSV reservation area, an electrical interconnection within the design file of the first chip of the 3-D IC.

4 Claims, 10 Drawing Sheets

(56) References Cited

OTHER PUBLICATIONS

Pathak et al., "Through-Silicon-Via Management during 3D Physical Design: When to Add and How Many?," International Conference on Computer-Aided Design, Nov. 7-11, 2010, pp. 387-394, © 2010 IEEE D.O.1.: 10.1109/ICCAD.2010.5653703.
Mell et al., "The NIST Definition of Cloud Computing," National Institute of Standards and Technology, U.S Department of Commerce, Special Publication 800-145, Sep. 2011.
Chien et al., "Redundant-Via-Aware ECO Routing," 19th Asia and South Pacific Design Automatin Conference, Jan. 20-23, 2014, pp. 418-423, © 2014 IEEE D.O.I.: 10.1109/ASPDAC.2014.6742927.
Pathak et al., "Through-Silicon-Via Management during 3D Physical Design: When to Add and How Many?," International Conference on Computer-Aided Design, Nov. 7-11, 2010, pp. 387-394, © 2010 IEEE D.O.I.: 10.1109/ICCAD.2010.5653703.
Mell et al., "The NIST Definition of Cloud Computing," National Institute of Standards and Technology, U.S. Department of Commerce, Special Publication 800-145, Sep. 2011.
List of IBM Patents or Patent Applications Treated as Related.

\* cited by examiner

INTEGRATED CIRCUIT DESIGN CHANGES USING THROUGH-SILICON VIAS

CROSS-REFERENCE TO RELATED APPLICATIONS

The present application claims priority of U.S. patent application Ser. No. 14/477,976 filed Sep. 5, 2014 the whole contents and disclosure of which are incorporated herein by reference.

BACKGROUND

The present disclosure generally relates to three-dimensional integrated circuit (IC) devices. In particular, this disclosure relates to arrangements of multiple integrated circuit chips in a stacked configuration, interconnected by through-silicon vias (TSVs).

A TSV may be a vertical electrical connection structure that may pass partially or completely through a semiconductor die. TSVs may be formed in a semiconductor die, for example, by using an etching process to create a hole through the die, depositing an insulating/lining material on the surface of the hole and surrounding semiconductor, and subsequently filling the hole with a conductive material, such as tungsten, copper or aluminum. The conductive material may be used to electrically connect circuits formed on one planar side of a first semiconductor die to circuits of a second semiconductor die, stacked against the other planar side of the first die.

A TSV may be useful in enabling stacking and electrical interconnection of multiple IC chips to create high-density circuit structures having relatively short interconnections, high performance, and high density. One such circuit structure, known as a stacked memory device, may include a plurality of memory chips vertically interconnected to each other, and to a die that includes logic functions. Stacked memory device logic functions may include management of memory operations such as reading, writing, maintenance, and interface with external components, such as a processor chip.

SUMMARY

Various aspects of the present disclosure may be useful for implementing engineering change orders (ECOs) into the design of a 3-dimensional integrated circuit (3-D IC). A 3-D IC designed according to embodiments of the present disclosure may incorporate logic and connectivity changes, specified after a floorplanning and/or routing stage of a design process, into the 3-D IC design.

Embodiments may be directed towards a method for adding an electrical interconnection within a 3-D IC. The method may include creating, within a 3-D IC design file that specifies a layout for a first chip of the 3-D IC, design data corresponding to a set of through-silicon via (TSV) reservation areas. The method may also include receiving an ECO and releasing, in response to the ECO, at least one TSV reservation area for reuse. The method may also include adding, by re-using at least one TSV reservation area, an electrical interconnection within the design file of the first chip of the 3-D IC.

Embodiments may also be directed towards a computer program product for adding an electrical interconnection within a 3-D IC. The computer program product may include a computer readable storage medium. The computer readable storage medium may contain program instructions executable by one or more processor circuits. The program instructions may cause the one or more processor circuits to create, within a design file of a 3-D IC that specifies a layout for a first chip of the 3-D IC, design data corresponding to a set of TSV reservation areas. The program instructions may also cause the one or more processor circuits to receive an ECO and release, in response to the ECO, at least one TSV reservation area for reuse. The program instructions may cause the one or more processor circuits to add, by re-using at least one TSV reservation area, an electrical interconnection within the design file of the first chip of the 3-D IC.

Embodiments may also be directed towards an system for adding an electrical interconnection within a 3-D IC. The system may include a 3-D IC. The 3-D IC may have a first chip with a plurality of TSV reservation areas and a second chip. The system may also include a design file configured to contain design data for the 3-D IC, an ECO and one or more processor circuits. The one or more processor circuits may be configured to create, within the design file of a 3-D IC that specifies a layout for the first chip of the 3-D IC, design data corresponding to a set of TSV reservation areas, and to receive an ECO. The one or more processor circuits may also be configured to release, in response to the ECO, at least one TSV reservation area for reuse, and to add, by re-using at least one TSV reservation area, an electrical interconnection within the design file of the first chip of the 3-D IC.

Aspects of the various embodiments may be used to make efficient use of area on semiconductor chips included within 3-D ICs. Aspects of the various embodiments may also be useful for providing cost-effective design changes for use in 3-D IC designs by using existing and proven design, floorplanning, routing and 3-D IC fabrication technologies.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
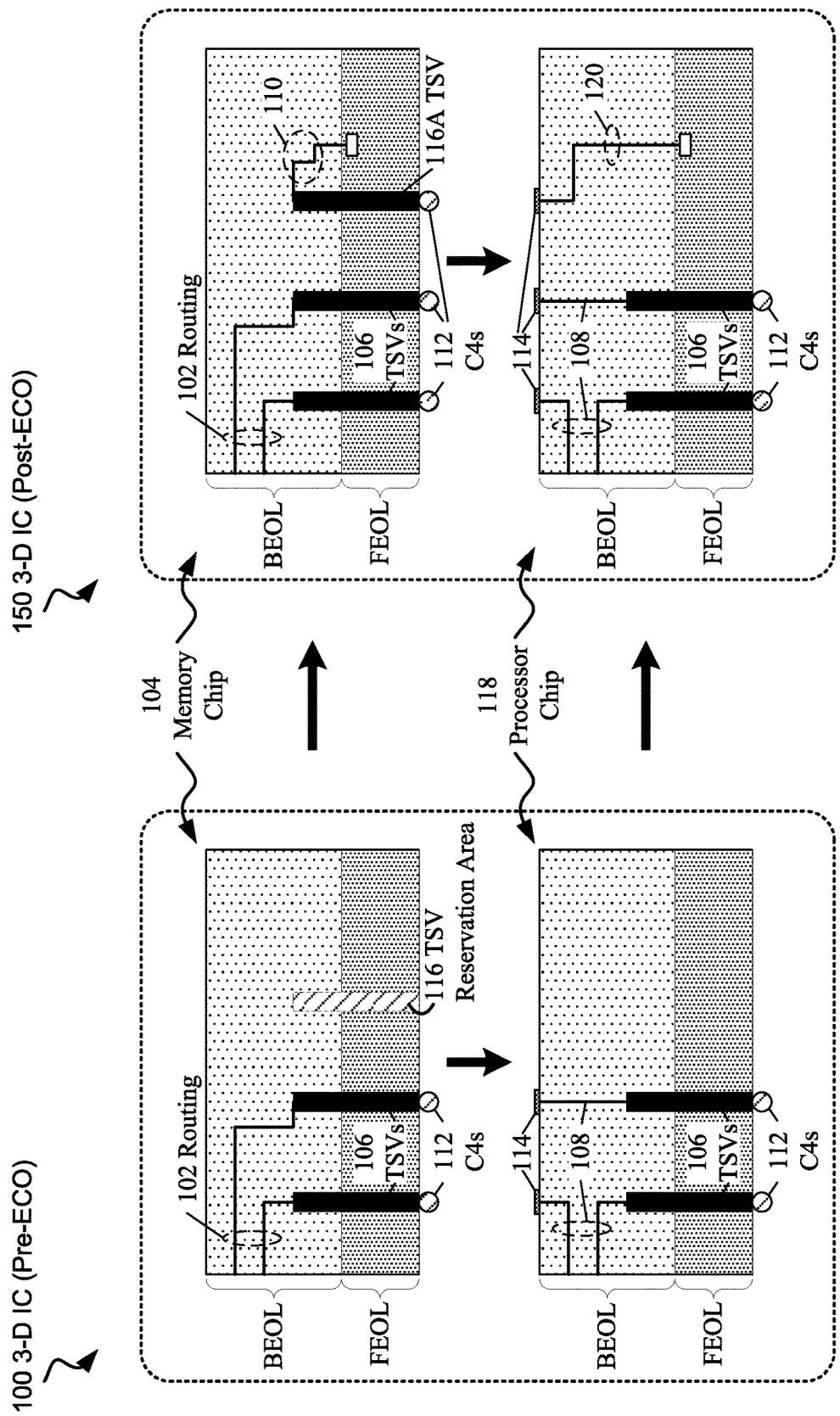
FIG. 1 depicts two cross-sectional views of a three-dimensional integrated circuit (3-D IC), including a processor chip and a memory chip with a through-silicon via (TSV) reservation area, according to embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

In the drawings and the Detailed Description, like numbers generally refer to like components, parts, steps, and processes.

DETAILED DESCRIPTION

Certain embodiments of the present disclosure can be appreciated in the context of implementing engineering change orders (ECOs) in the design of three-dimensional integrated circuits (3-D ICs). While not necessarily limited thereto, embodiments discussed in this context can facilitate an understanding of various aspects of the disclosure. In certain embodiments, 3-D ICs may be used in electronic equipment such as a system on a chip (SoC) device. An SoC device may be an integrated circuit (IC) or 3-D IC that includes and integrates many components of a computer or other system into a single chip. An SoC device may contain digital, analog, mixed-signal, and radio-frequency functions. Certain embodiments may also be directed towards implementing ECOs in the design of other equipment and associated applications, such as 3-D ICs including processor chips, and sensor array chips. 3-D ICs, including sensor array chips, may be used in electronic equipment such as mobile devices. Mobile devices may be used to provide data and communications, through a wireless network, to a user, and may include, but are not limited to cell phones, personal digital assistants (PDAs), tablet and notebook computers, digital cameras and pagers. Embodiments may also be directed towards implementing ECOs in the design of stacked memory chips, which may be useful as high-speed, high-density memory in certain applications such as non-volatile (e.g., flash) memory devices and portable computing devices.

3-D ICs may include planar stacks of semiconductor chips which may be electrically interconnected by through-silicon vias (TSVs). 3-D ICs may be useful in certain applications where compact circuit size, dense, short, high-performance interconnect and reduced power consumption are important to meet product design goals. 3-D ICs may be useful in applications such as cell phones, digital cameras, stacked memory devices and hybrid processor/memory devices.

TSVs used to interconnect chips within a 3-D IC may occupy a relatively large amount of chip area, in both front-end-of-line (FEOL) and back-end-of-line (BEOL) layer regions, which may otherwise be populated with active devices (e.g., transistors) and metal routing used to interconnect active devices. For example, the area used for a single TSV may also be used for several hundred field-effect transistors (FETs), in FEOL layers, and hundreds of routing wires, spanning several BEOL layers. The area consumption "cost" of inserting TSVs into a chip and/or 3-D IC design may be considered and accommodated early in a design process, such as in the architectural, floorplanning and layout design stages.

A 3-D IC may be a complex system which may have architectural or design changes at any point in its design process, including after the floorplanning and/or chip layout stages, for example, within the last three to four months of the design. 3-D IC design and/or architectural changes may result from simulation and/or architectural verification results that indicate a design error or the need for an architectural/design change of the 3-D IC circuitry. Design changes may require placement of additional circuits and/or interconnections on a particular chip layout which may also require changes or additions to vertical (e.g., TSV) routing to at least one other chip within the 3-D IC.

If unused TSVs are not available when an ECO is received, implementing the additional specified interconnections between chips may not be possible without displacing existing logic functions and/or wiring. If the number of TSVs available is insufficient to service the ECO request, implementing the ECO may require further floorplanning and layout activities and/or additional chip fabrication activity, both of which may incur additional time and expense. If the ECO request is not able to be fulfilled, the 3-D IC may either malfunction or have compromised performance.

Various embodiments of the present disclosure relate to a method for planning and implementing ECOs specifying changed and/or additional TSV interconnect between chips of a 3-D IC design. The method may therefore be useful for integrating TSV interconnect into an existing 3-D IC design while limiting redesign activity in response to the ECO specifications. A robust 3-D IC design, without design errors, may result from the use of the method of implementing the ECO. The method may allow interconnect changes designed to solve signal, clock and power distribution design problems to be implemented, while limiting the impact, including design time, cost and effort, to the existing 3-D IC design.

A 3-D IC designed according to certain embodiments may be compatible with existing and proven electronic equipment, systems, and design methodologies, and may be a useful and cost-effective way of modifying existing designs for solving unforeseen design problems. A 3-D IC constructed according to embodiments of the present disclosure may be used with existing electronic hardware and systems.

Implementing a method for managing TSV interconnects in the design of 3-D ICs may be useful in meeting ECO specifications for additional and re-allocated TSVs used to electrically connect two or more chips within the 3-D IC. An ECO process may also limit or reduce 3-D IC design cost and time by accommodating a limited number of changes to the 3-D IC design without requiring replication of extensive floorplanning, layout or fabrication activities.

An ECO implementation method may allow changes or additions to data, control signal, power distribution and clock (TSV) interconnect to be implemented, in the design of an IC, which may arise after the initial floorplanning and layout of the IC. The method may use spare TSVs or TSV reservation areas to create new interconnections, specified by an ECO, that are useful for adding data, control or clock signals or power distribution connections. The method may result in the 3-D IC having a more robust and/or error-free final implementation. Spare TSVs and/or areas reserved for TSVs may be allocated, early in the design process, by the method, in strategic locations in one or more IC designs, which may result in efficient use of semiconductor area on the chips of the 3-D IC, and may limit the number of unused TSVs.

Certain embodiments relate to a method for planning and implementing ECOs in the design of 3-D ICs. FIG. 1 depicts two cross-sectional views 100 (before an ECO implementation) and 150 (after an ECO implementation) of a 3-D IC, including a memory chip 104 and a processor chip 118. Memory chip 104 includes a TSV reservation area 116 (view 100) which may be converted into a TSV 116A (view 150) during the implementation of an ECO, according to embodiments of the present disclosure. Conversion of a TSV reservation area (e.g., 116) to a TSV (e.g., 116A) may be useful in providing a supplemental connection between two or more semiconductor chips of a 3-D IC, following a layout and/or routing phase of one or more of the chips (e.g., memory chip 104). According to embodiments, the methods described herein may be carried out by executing instructions on a computer processor, e.g., in order to add an electrical interconnection within a 3-D IC.

Supplemental TSV connections between chips of a 3-D IC may be useful in providing additional interconnect, specified by an ECO, which may be used, for example, to interconnect logic circuits specified by the ECO, on a first chip, to logic circuits on a second chip. Supplemental TSV connections, specified by ECOs, between chips may also be used to create robust power distribution networks, and add clock distribution, data and control signal interconnections between two or more chips within a 3-D IC.

Views 100, 150 depict memory chip 104 and processor chip 118 having front-end-of-line (FEOL) and back-end-of-line (BEOL) layer regions, TSVs 106, controlled collapse chip connections (C4s) 112, conductive pads 114 and routing interconnections 102, 108, respectively. The FEOL layer region may generally include active and passive electronic components, such as field-effect transistors (FETs), resistors and capacitors, fabricated within the semiconductor substrate. The BEOL layer region may generally include interconnect structures, such as metal wires and vias, fabricated in layers above, and used to interconnect, the electronic components in the FEOL layers. TSVs 106 may be used to conduct signals between one planar face (e.g., bottom) of a chip, for example, processor chip 118, and another planar face (e.g., top) of the processor chip 118, and may also be electrically connected to routing structures and active electronic components within the chip.

TSVs 106 may be located in specified locations or regions of a chip during a floorplanning and/or layout phase of the chip design. Controlled collapse chip connections (C4s) 112 and conductive pads 114 may be used to electrically interconnect TSVs of a first chip (e.g., memory chip 104) with TSVs or routing (e.g., 108) of a second chip (e.g., processor chip 118). For simplicity of illustration, views 100, 150 depict memory chip 104 and processor chip 118 as physically separated, however, after a bonding process during the fabrication of a 3-D IC, chips 104, 118 may be located so that C4s 112 of chip 104 touch, and are then subsequently bonded, through a solder reflow process, to conductive pads 114 of chip 118.

According to embodiments, the method for adding an electrical interconnection within a 3-D IC may include creating, within a design file specifying a layout for a first chip (e.g., 104) of the 3-D IC, design data for a set of TSV reservation areas (e.g., 116). A TSV reservation area may be an area (also referred to as a "keep out" area) reserved for the possible creation of TSVs, which may occur at a later stage of the design process. A TSV reservation area may be created in a design file, using electronic design automation (EDA) software, during a relatively early stage, such as floorplanning or layout, of the chip/3-D IC design process, before detailed placement of active circuits (e.g., logic devices) and circuit routing is completed.

TSV reservation areas may be strategically placed within or near particular groups of signals that may have a relatively high probability of anticipated interconnect changes or additional signals specified by an ECO. In a certain application, for example, a group of control signals may be anticipated to have a high probability of changes resulting from an ECO, and in certain applications, data, address or clock signals may be anticipated to have a high probability of ECO-related changes. A number of TSV reservation areas added corresponding to a particular signal group may be determined by a ratio (or range of ratios) for that signal group type. For example, a ratio of a number of TSVs having a fixed layout location to a number of spare TSVs used to conduct control signals may be 10:1. Other signal types (e.g., data, clock) may use other ratios.

Once the TSV reservation areas (e.g., 116) have been created, an ECO, which may specify new interconnect additions and/or changes between a first (e.g., 104) and a second (e.g., 118) chip of the 3-D IC design, may be received. In certain embodiments, the ECO may be received, by an EDA program or system, as an electronic file which may subsequently be processed by the EDA program or system. In certain embodiments the ECO may be in the form of a printed or electronic document received by a designer, and which may be subsequently responded to by the designer interacting with an EDA program or system.

In response to the ECO, at least one TSV reservation area (e.g., 116, view 100) may be released, from a reserved status, for reuse as a TSV. A reserved status, within a design file, of a chip area, may indicate that the particular area may not be used, for example, by EDA software, for circuits and/or routing. View 100 depicts a processor chip 118 with a particular configuration, for example, having six processor cores. View 150 may depict processor chip 118 with a second configuration, for example, having eight processor cores, resulting in additional routing 120 to be connected to memory chip 104. A TSV reservation area, e.g., 116 (view 100), may be located in a region that enables it to be aligned with a conductive pad 114 connected to routing 120, and may therefore be released, in response to the ECO, from a reserved status for use as a TSV.

The TSV reservation area 116 (view 100) may be converted, within a design file, using EDA software, from a reservation area to design data specifying a TSV 116A that can add electrical interconnection of routing 110 of memory chip 104 to routing 120 of processor chip 118. Routing 110 and 120 (view 150) may be used to electrically connect active devices (e.g., logic circuits) on memory chip 104 and processor chip 108, respectively, together, through TSV 116A.

In certain embodiments, one or more TSV reservation areas may be released, in response to a specification within the ECO of additional routing area. For example, if an ECO specifies a need for additional signal routing within BEOL layers in the region that includes a TSV reservation area, and the TSV reservation area is not needed as a TSV, then the TSV reservation area may be used for adding routing lanes. In certain embodiments, one or more TSV reservation areas may be released, in response to a specification within the ECO of additional circuit area. For example, if an ECO specifies a need for additional circuit placement area within FEOL layers in a region that includes a TSV reservation area, and the TSV reservation area is not needed as a TSV, then the TSV reservation area may be used for placement of additional circuits, for example, logic devices.

Figure 2:
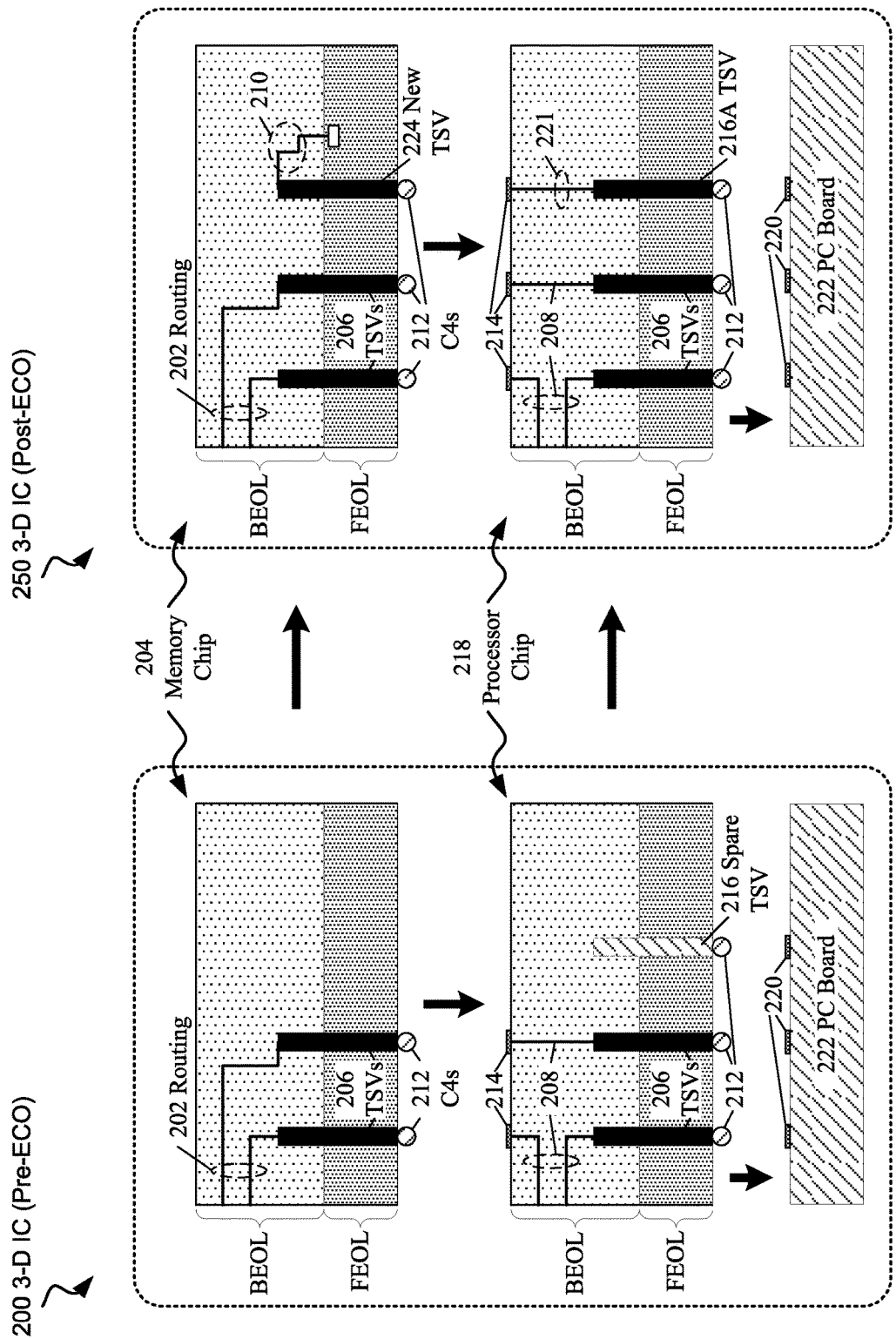
FIG. 2 depicts two cross-sectional views of a 3-D IC, including a printed circuit (PC) board, a processor chip with a spare TSV and a memory chip, according to embodiments.

FIG. 2 depicts two cross-sectional views 200 (before an ECO implementation) and 250 (after an ECO implementation) of a 3-D IC, including a memory chip 204, a processor chip 218 and a printed circuit (PC) board 222. Processor chip 218 includes a spare TSV 216 (view 200) which may be converted into a TSV 216A (view 250) during the implementation of an ECO, according to embodiments of the present disclosure consistent with FIG. 1. Conversion of a spare TSV (e.g., 216) to a used TSV (e.g., 216A) may be useful in providing a supplemental connection between two or more semiconductor chips of a 3-D IC, following a layout and/or routing phase of one or more of the chips (e.g., processor chip 218). According to embodiments, the methods described herein may be carried out by executing instructions on a computer processor, e.g., in order to add an electrical interconnection within a 3-D IC.

According to embodiments, a spare TSV may be a TSV that is created in a design file, using EDA software, during a relatively early stage, such as floorplanning or layout, of the chip/3-D IC design process, before detailed placement of active circuits (e.g., logic devices) and circuit routing is completed. Spare TSVs may be strategically placed, similarly to TSV reservation areas (FIG. 1), within or near particular groups of signals. During various chip fabrication process stages, a spare TSV may become a physical structure which may span one or more of FEOL and/or BEOL layer regions.

Views 200 and 250 depict memory chip 204 and processor chip 218 having FEOL and BEOL layer regions, TSVs 206, C4s 212, conductive pads 214 and routing 202, 208, respectively. Views 200 and 250 also depict PC board 222 with conductive pads 220.

For simplicity of illustration, views 200, 250 depict memory chip 204, processor chip 218 and PC board 222 as physically separated, however, after a bonding process during the fabrication of a 3-D IC, chips 204, 218 may be located so that C4s 212 of memory chip 204 touch, and are then subsequently bonded, through a solder reflow process, to conductive pads 214 of processor chip 218. Similarly, C4s 212 of processor chip 218 are then subsequently bonded to conductive pads 220 of PC board 222. PC board 222 may be useful as a platform on which to mechanically mount and through which to electrically interconnect a 3-D IC, including chips 204, 218, with other electronic devices.

In embodiments, a spare TSV may be added, in response to a specification within the ECO, along with TSV reservation areas and released TSV reservation areas, to a list of spare TSVs. TSV reservation areas may be converted, in response to a specification within an ECO, into a spare TSV, which may be used to create electrical interconnections within a chip. According to embodiments, spare TSVs may be made part of (connected to) a power distribution network, electrically connected to a particular net or conductive pad, or left "floating"; electrically isolated from other electrical conductors.

In response to an ECO, at least one spare TSV (e.g., 216, view 200) may be converted to a TSV assigned to a net. View 200 may depict a particular version of memory chip 204 with a particular configuration, for example, having a certain number of address lines. View 250 may depict memory chip 204 with a second configuration, for example, having an additional address line, resulting in additional routing 210 to be connected to PC board 220. A spare TSV, e.g., 216 (view 200), may be located in a region that enables it to be aligned with a conductive pad 220 connected to PC board 222, and may therefore be used, in response to the ECO, as a TSV. A new TSV 220 (view 250) may be created in memory chip 204, and may be used to connect routing 210 to routing 221 (view 250).

The spare TSV 216 (view 200) may be converted, within a design file, using EDA software, from design data specifying a spare TSV to design data specifying a TSV 216A. The spare TSV 216 may be assigned to a net which can add electrical interconnection of routing 221 of processor chip 218 to routing 210 of memory chip 204. Routing 210 and 221 (view 250) may be used to electrically connect active devices (e.g., logic circuits) on memory chip 204, through processor chip 218, to PC board 222. In certain embodiments, assigning a spare TSV from the list of spare TSVs to a net may include fabricating the TSV.

Figure 3:
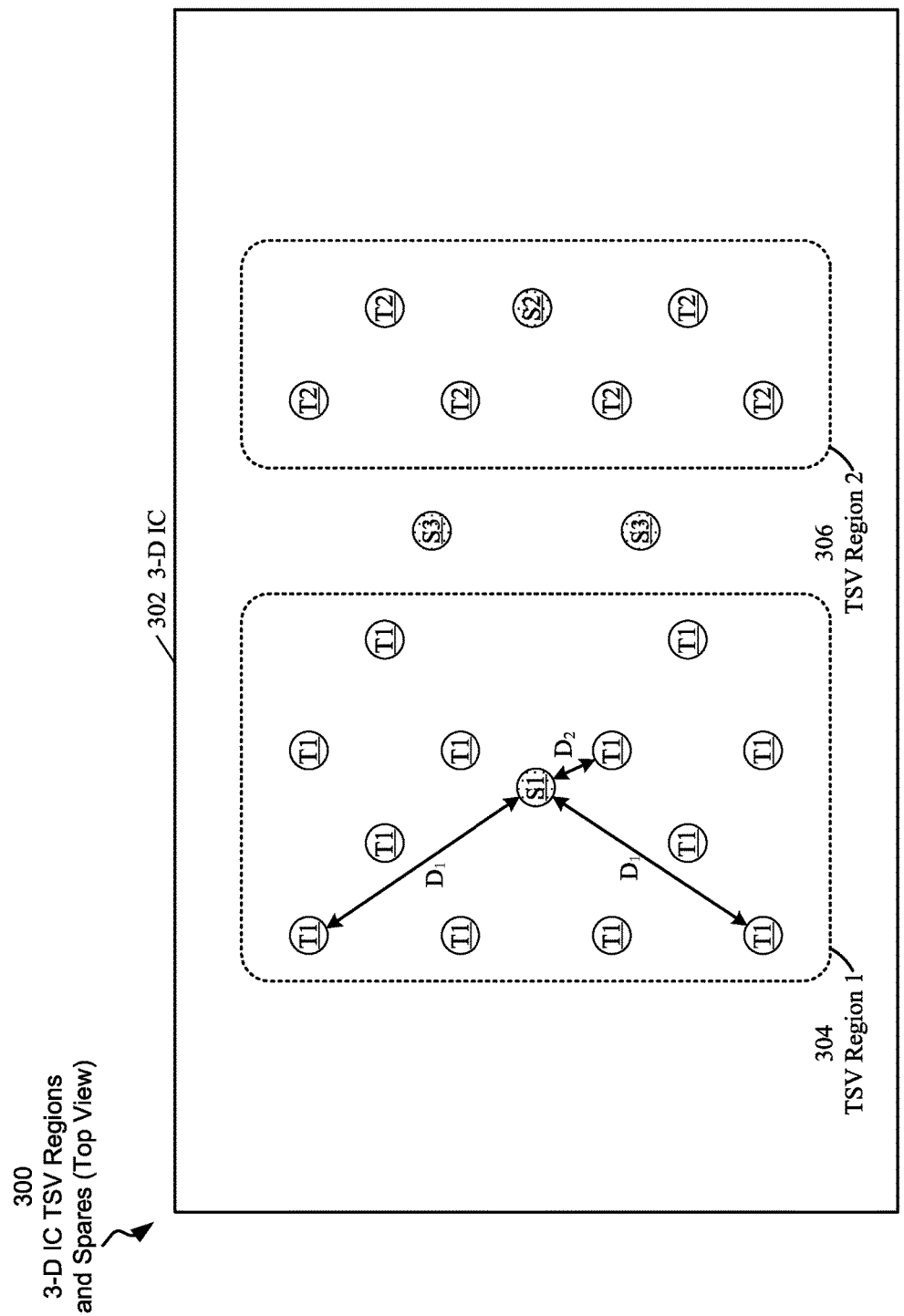
FIG. 3 depicts a top view of a 3-D IC, including two TSV regions and spare TSVs, according to embodiments.

FIG. 3 depicts a top view 300 of a 3-D IC 302, including TSV regions 304, 306, TSV types T1, T2 and TSV reservation area types S1, S2 and S3, according to embodiments consistent with the figures. FIG. 3 may be useful in depicting how TSV reservation areas (e.g., S1, S2, S3) may be strategically distributed within and between TSV regions (e.g., 304, 306) so that the number of available TSV reservation areas is both sufficient to meet anticipated needs of ECOs, as well as make efficient use of semiconductor FEOL and BEOL area. For ease of discussion, the term "TSV reservation areas" is used herein in the discussion of FIG. 3, however, it is understood that various embodiments can also relate to spare TSVs and/or released TSV reservation areas.

In embodiments, TSV regions 304 and 306 may be areas containing TSVs that are assigned to nets conducting certain types of signals such as data, control logic and clock signals and power distribution conductors. For example, in an embodiment, TSVs T1 in TSV region 1 may be assigned to control logic signal nets while TSVs T2 in TSV region 2 may be assigned to data signal nets. In certain embodiments, a TSV region such as TSV region 1 may contain TSVs assigned exclusively to a certain type of signal net (e.g., control logic signals), and in certain embodiments, a TSV region may contain TSVs assigned to a plurality of signal net types, for example, control logic signals and data signals. A TSV region may have a square, rectangular, circular, oval, or any regular or irregular geometric shape.

A first TSV region (e.g., TSV region 1) may have a plurality of locations where TSV reservation areas (e.g., S1) may be placed such that the distance $D_2$ between each TSV reservation area and all the TSVs (e.g., T1) within that TSV region is less than or equal to a specified maximum distance $D_1$. A specified maximum distance between a TSV reservation area and all of the TSVs within a certain TSV region (e.g., $D_1$) may be useful in increasing the probability of a connection utilizing a TSV in the TSV reservation area being routable, for example, by EDA software. A specified maximum distance may also be useful in limiting wiring delays associated with connections utilizing a TSV in the TSV reservation area. A second TSV region (e.g., TSV region 2) may have a plurality of locations where TSV reservation areas (e.g., S2) may similarly be placed to limit the distance between any TSV reservation area and all the TSVs (e.g., T2) within that TSV region.

In certain embodiments, TSV reservation areas (e.g., S3) may be placed between TSV regions (e.g., TSV region 1 and TSV region 2), and may provide a TSV reservation area that may be useful for adding or modifying connections using TSVs of either region, while limiting the maximum distance between the TSV reservation area and TSVs within both regions. TSV reservation areas that are shared between adjacent regions may also be useful in making efficient use of TSV reservation or spare TSVs.

In certain embodiments, a channel routing algorithm, which may be part of EDA software, may be used to determine a length of a routed net that includes a particular TSV reservation area. A channel routing algorithm may be used to select and/or assign TSVs to the routing of a particular net. Similarly, a net timing algorithm may be used to determine a signal propagation delay of a routed net that includes the TSV. If net timing constraints for a particular net are not met through the use of a TSV within a certain TSV reservation area, in certain embodiments, the TSV reservation area may be swapped with a previously assigned TSV. TSV swapping may be useful in reducing net length and/or delay and in meeting net timing constraints for a particular net.

In certain embodiments, a ratio of assigned TSV locations to TSV reservation areas (or spare TSVs) for a particular signal types may be useful in determining a number of TSV reservation areas to populate within a TSV region having TSVs assigned to particular signal net types. For example, Table 1 details possible ratios for TSVs assigned to three signal types; data/control signals clock signals and power/ground nets. The ratios listed in Table 1 are examples; other ratios and ranges of ratios are possible. Data and control signals, as illustrated in Table 1, may have a range of assigned to spare TSV ratios ranging from 8:1 to 10:1.

TABLE 1

| Signal Type | Assigned TSV:Spare TSV ratio |
|---|---|
| Data & Control | 8:1 → 10:1 |
| Clock | 15:1 |
| Power/GND | 15:1 |

Figure 4:
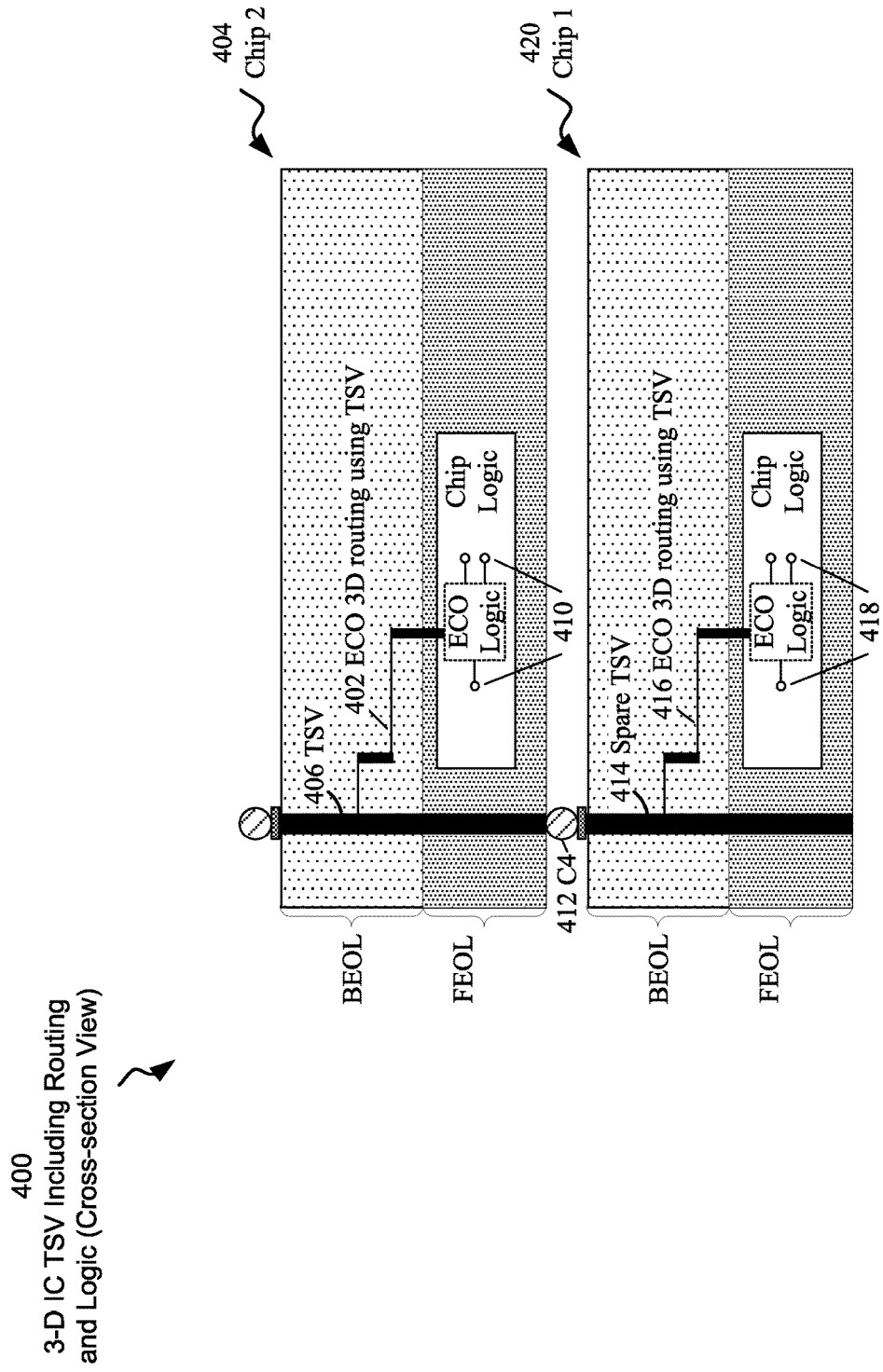
FIG. 4 depicts a cross-sectional view of a 3-D IC, including two chips electrically connected by TSVs, engineering change order (ECO) 3-D routing and ECO logic, according to embodiments.

FIG. 4 depicts a cross-sectional view 400 of a 3-D IC, including chip 1 420 and chip 2 404 having sections of chip logic that are electrically interconnected through TSV 406 and spare TSV 414, according to embodiments consistent with the figures. FIG. 4 may be useful in illustrating how ECO logic, ECO 3-D routing 402, 416 (within a BEOL layer region of a chip) and ECO 2-D routing 410, 418 may be used, in conjunction with one or more TSVs and spare TSVs, to interconnect sections of chip logic on two or more chips within a 3-D IC.

ECO logic within the chip logic of chips (e.g., 404, 420) that are interconnected within a 3-D IC may be useful in providing interface functions between the chip logic and TSVs or spare TSVs. For example, in embodiments, ECO logic may include driver circuits which may have sufficient drive strength to drive logic signals from one chip, through TSVs and interconnect, to another chip while meeting electrical and timing specifications. ECO logic may also include receiver circuits and tri-state driver circuits which may be controlled to allow bi-directional signal transfer between chips of the 3-D IC in which may be useful for making efficient use of TSVs. In certain embodiments, ECO logic may also include circuits that may serialize and deserialize data transferred between chips, or provide other high-level interface or protocol management. In certain embodiments, signal nets may be connected directly to TSVs (e.g., 406, 414) without the use of ECO logic, ECO 2-D or ECO 3-D routing.

ECO logic, within an FEOL the region of a chip, may be integrated within a block of chip logic and may be interconnected using routing (e.g., 410, 418) channels at levels used to interconnect circuits within the chip logic. In embodiments, ECO logic may be implemented in response to a specification within an ECO, and in certain embodiments may be placed within unused, released TSV reservation areas. In certain embodiments, an ECO specifying ECO logic may also specify routing (e.g., 410, 418) between the ECO logic and associated chip logic, and 3-D routing (e.g., 402, 416) to connect the ECO logic to a TSV 406 or spare TSV 414, respectively. A spare TSV (e.g., 414) or TSV reservation area within a limited distance of the ECO logic and chip logic may be chosen, from a list of spare TSVs, in order to limit the length and delay of 3-D routing (e.g., 416).

The addition, in response to an ECO, of ECO logic connected to chip logic and TSVs by 2-D routing and 3-D routing, respectively, may provide a complete supplemental connection between sections of chip logic on two or more chips of a 3-D IC. A supplemental connection may be useful for including interconnection changes or enhancements to a 3-D IC while limiting redesign time, effort and expense.

Figure 5:
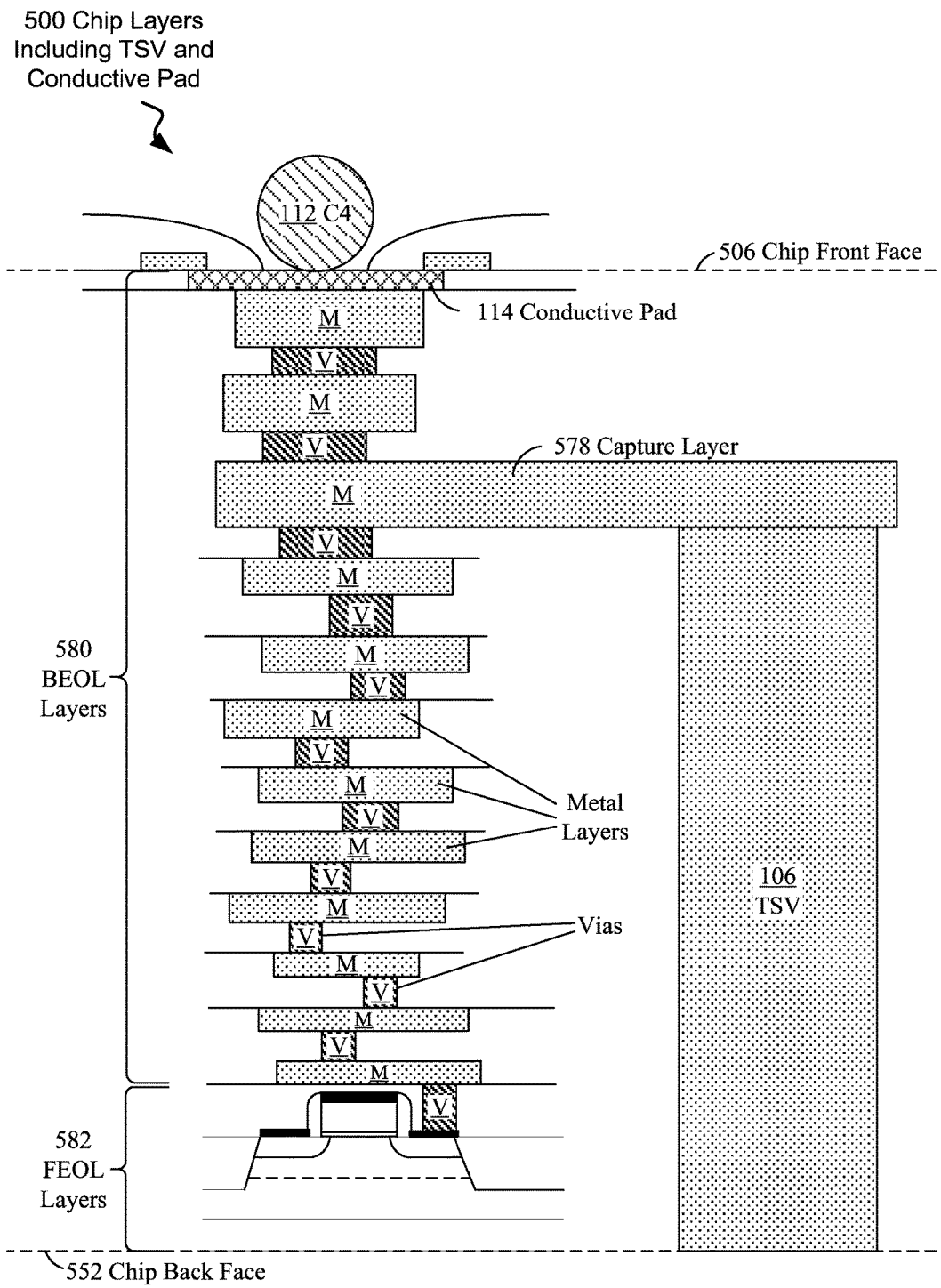
FIG. 5 depicts a cross-sectional view of a semiconductor chip, including active layers, metal layers, via layers and a TSV, according to embodiments.

FIG. 5 depicts a cross-sectional view 500 of layers of a semiconductor chip, including active (FEOL) layers 582, metal (BEOL) layers 580 including via layers "V" and metal layers "M", a TSV 106, and a capture layer 578, according to embodiments consistent with the figures. FIG. 5 may be useful for illustrating placement, structure and interconnection of active devices, conductive layers, TSVs and conductive pads of chips within a 3-D IC.

Process steps to create front-end-of-line (FEOL) layers 582 may be the first portion of a fabrication process sequence which may include creation of individual electronic devices such as transistors, capacitors and resistors, on a semiconductor substrate. FEOL process steps may generally include all integrated circuit (IC) fabrication steps up to (but not including) the deposition of metal interconnect layers.

FEOL process steps may include all fabrication operations used to form, for example, isolated complementary metal-oxide semiconductor (CMOS) devices such as P-channel field-effect transistors (PFETs) and N-channel field-effect transistors (NFETs). FEOL steps may also be used to produce "deep trench" devices such as capacitors used in dynamic random-access memory (DRAM) devices. FEOL layers may be located above a back face 552 of a semiconductor chip, and may be separated from the back face 552 by bulk semiconductor material and/or and oxide layer.

Process steps to create back-end-of-line (BEOL) layers 580 may be the second portion of an IC fabrication process which may include interconnection, by wiring (e.g., metal layers "M" and via layers "V") individual devices (e.g., transistors, capacitors and resistors) on a semiconductor substrate. BEOL process steps may generally begin with deposition of a first metal layer on the semiconductor substrate. BEOL steps may include forming contacts, insulating layers (dielectrics), metal levels "M", via structures "V" and conductive pads 114. A BEOL process may be used to add ten or more metal layers which may interconnect electronic devices on the semiconductor substrate.

Conductive pads 114 may be used as attachment sites for controlled collapse chip connections (C4s) which may be used to physically and electrically connect a semiconductor chip to another semiconductor chip, an electronic package, a printed circuit board, or other electronic device. The conductive pad 114 may be located at the front face 506 of the semiconductor chip. In embodiments, design data corresponding to a set of TSV reservation areas may include at least one of the FEOL layers and BEOL layers. In embodiments, FEOL reservation areas may include all layers between the chip back face 552 and the first BEOL layer of layers 580 and BEOL reservation areas may include all layers between the top of the FEOL layers 582 and the capture layer 578.

A TSV may be formed within the semiconductor chip, and may extend from the chip back face 552 to a capture layer 578, which may be electrically connected to other metal and/or via layers, including conductive pad 114, within the BEOL layers 580. TSV fabrication steps may be performed during and in conjunction with FEOL process steps and/or BEOL process steps.

The capture layer 578 may be any metallization layer of the semiconductor chip. The vertical location of capture layer 578 may include any metallization layer "M" between, and including, the first metallization layer (adjacent to and above the active devices in the FEOL layers 582), to the conductive pad 114 layer, at the chip front face 506. In embodiments, the vertical location of capture layer 578 may depend on semiconductor fabrication processes, and/or a particular fabrication stage at which and ECO is received and implemented. The TSV 106 may be useful for establishing an electrical connection from the chip back face 552, through the FEOL layers, to the capture layer. The capture layer may be useful for extending the electrical connection of the TSV into a range of BEOL metal layers 580. In certain embodiments, a TSV 106 may extend from the chip back face 552 to a metallization layer "M". In certain embodiments, a TSV 106 may extend from the chip back face 552 to the conductive pad 114.

Figure 6:
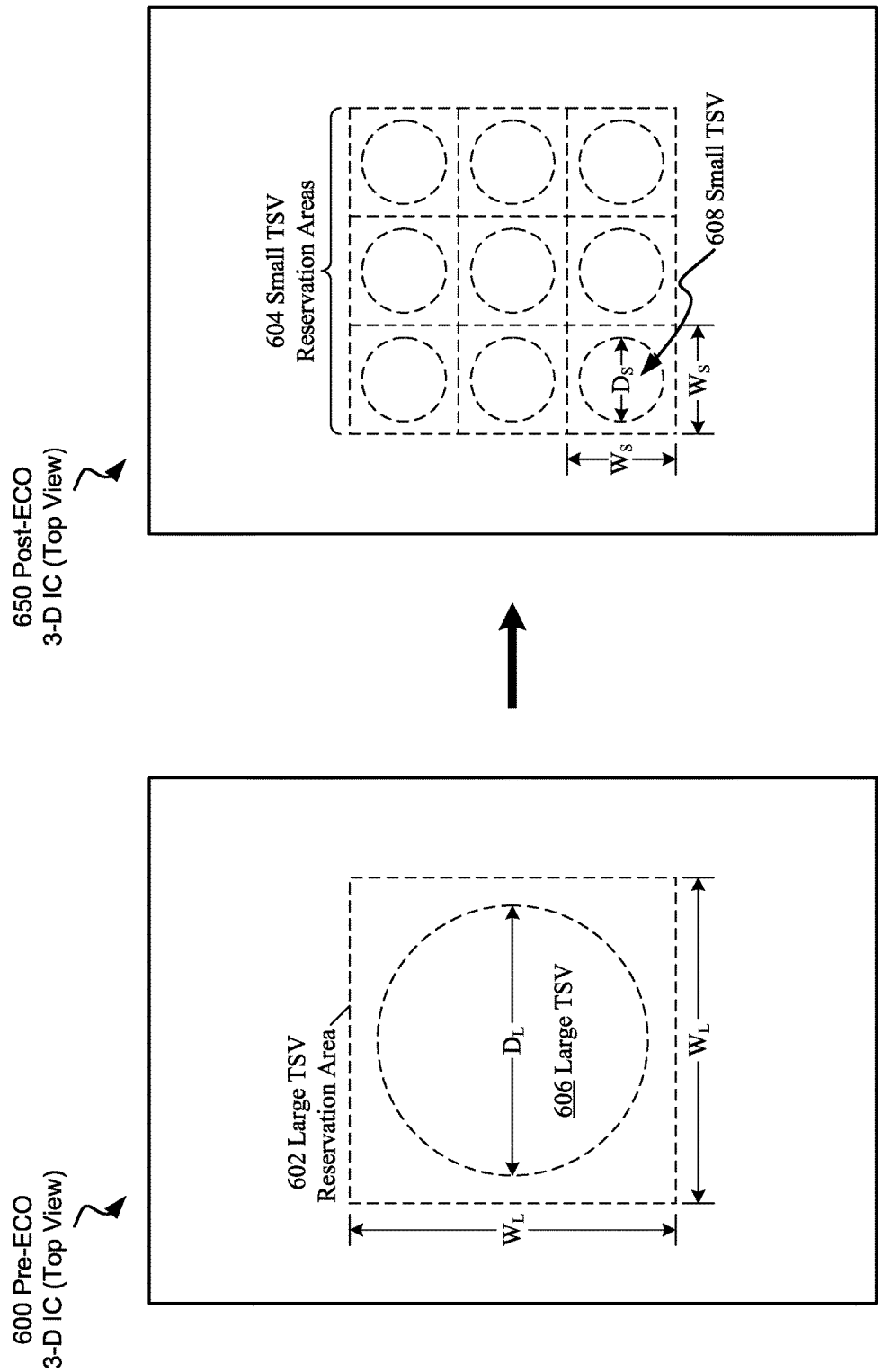
FIG. 6 depicts two top views of a 3-D IC including a large TSV reservation area and a plurality of small TSV reservation areas, according to embodiments.

FIG. 6 depicts two top views 600 (before an ECO implementation) and 650 (after an ECO implementation) of a 3-D IC including a large TSV reservation area 602 and a plurality 604 of smaller TSV reservation areas, according to embodiments consistent with the figures. Releasing a large TSV reservation area and reallocating it to a plurality of small TSV reservation areas may be useful for creating a number of smaller TSVs (e.g., for conducting signals) in an area formerly reserved for one larger TSV, which may have been reserved for power distribution purposes In certain embodiments, a large TSV reservation area 602 (view 600) may be released, for reallocation in response to a specification within an ECO. The larger TSV reservation area 602 (view 600) may have a first footprint dimensions of $W_L \times W_L$, which may be larger than a larger TSV 606 diameter $D_L$, to prohibit active circuits from being formed within a semiconductor area which may be adversely affected by TSV formation.

The larger TSV reservation area 602 (view 600) may be reallocated, in response to an ECO, to a plurality of smaller TSV reservation areas 604 (view 650), each having second footprint dimensions of $W_s \times W_s$, and a small TSV 608 diameter $D_s$, where $W_s$ is less than $W_L$ and $D_s$ is less than $D_L$. By way of example, in an embodiment, $W_L$ may be 25 μm and $D_L$ may be 20 μm, while $W_s$ may be 2 μm and $D_s$ may be 1 μm. Other footprint and diameter dimensions are possible, and may depend on TSV fabrication technology limitations.

Figure 7:
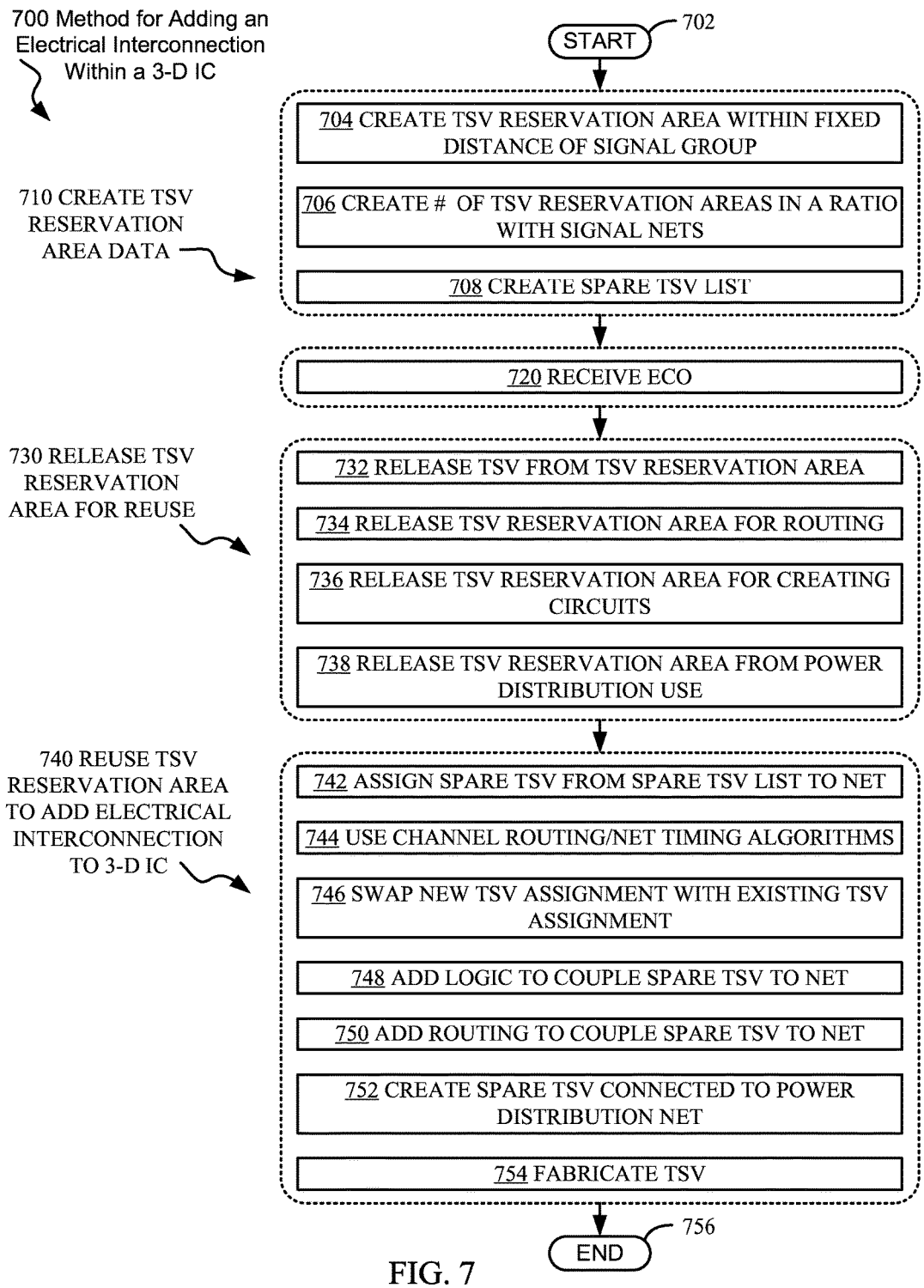
FIG. 7 is a flow diagram illustrating a method for adding an electrical interconnection within a 3-D IC, according to embodiments.

FIG. 7 is a flow diagram 700 illustrating a methodology for adding an electrical interconnection within a 3-D IC, according to embodiments consistent with the figures. The method for adding an electrical interconnection within a 3-D IC 700 may be useful in supplementing, in response to an ECO, existing vertical (TSV) interconnections between stacked die within a 3-D IC with additional TSV interconnections. The process 700 moves from start 702 to operation 710.

Operation 710 generally refers to creating TSV reservation area data, and may include at least one of operations 704, 706 and 708. TSV reservation area data may be created, using electronic design automation (EDA) software, within a design file of a semiconductor chip of the 3-D IC.

Operation 704 generally refers to creating TSV reservation area data within a fixed distance of a group of signals. In embodiments, a region of locations may be created where each of the locations has a distance that is less than a specified maximum distance from nets of at least one signal type, and at least one TSV reservation area may be placed within the region. Signal types may include data, control logic, clock and power distribution. Operation 704 may be useful for making efficient use of TSV reservation areas, while limiting routing length and/or delay associated with using TSVs created in TSV reservation areas.

Operation 706 generally refers to creating a number of TSV reservation areas, within a region of locations, by using a ratio of TSVs assigned to signal nets to TSV reservation areas. In certain embodiments, operation 706 may be useful for making efficient use of TSV reservation areas.

Operation 708 generally refers to creating, in response to a specification within an ECO of at least one new TSV connecting a first chip and a second chip, a list of spare TSVs, including TSV reservation areas, released TSV reservation areas and spare TSVs. The list of spare TSVs may be created using EDA software, and may be part of a chip and/or 3-D IC design file. In certain embodiments, operation 708 may be useful for accumulating IDs and locations of spare TSVs for future use in creating TSVs assigned to signal nets.

Once TSV reservation area data has been created, the process moves to operation 720.

Operation 720 generally refers to receiving an engineering change order (ECO). An ECO may be manually (e.g., using EDA software, or a text editor) or automatically generated. In certain embodiments, operation 720 may be useful for receiving specifications for modifications to a chip design. In certain embodiments, chip design modifications may include, but are not limited to, creating a spare TSV, allocating a TSV reservation area to a TSV and releasing a TSV reservation area for routing or circuit placement use. Once the ECO is received, the process moves to operation 730.

Operation 730 generally refers to releasing a TSV reservation area for reuse, in response to an ECO, and may include at least one of operations 732, 734, 736 and 738. A list of TSV reservation areas may be kept in a design file.

Operation 732 generally refers to releasing a TSV from a TSV reservation area, in response to an ECO. In certain embodiments, a TSV reservation area may be released for the purpose of creating a spare TSV or a TSV assigned to a particular net.

Operation 734 generally refers to releasing, in response to a specification within an ECO of additional routing area, at least one TSV reservation area for routing. TSV reservation areas may be generally released for routing when it is determined that they are not needed for creating additional assigned TSVs or spare TSVs.

Operation 736 generally refers to releasing, in response to a specification within an ECO of additional circuit area, at least one TSV reservation area for creating circuits. TSV reservation areas may be generally released for creating additional circuitry when it is determined that they are not needed for creating additional assigned TSVs or spare TSVs.

Operation 738 generally refers to releasing, in response to a specification within an ECO, a TSV reservation area from power distribution use. A TSV reservation area may identify a TSV or spare TSV that may have been formerly used as for power distribution (e.g., power or ground net) purposes.

Once a TSV reservation area is released for reuse, the process moves to operation 740.

Operation 740 generally refers to reusing, in response to a specification within the ECO of a new TSV interconnection between a first chip and a second chip of the 3-D IC, a TSV reservation area to add electrical interconnection to a 3-D IC. Operation 740 may include at least one of operations 742, 744, 746, 748, 750, 752 and 754.

Operation 742 generally refers to assigning a spare TSV from a spare TSV list to a net used to electrically interconnect a first chip and a second chip of the 3-D IC, in response to an ECO. In certain embodiments, the location of the spare TSV may be chosen to minimize the distance between the spare TSV and the net.

Operation 744 generally refers to using a channel routing and/or net timing algorithm to determine the length and/or timing delay of a net. A channel routing algorithm may be used to select and/or assign TSVs to the routing of a particular net. A channel routing algorithm may be useful to determine a length of a routed net that includes the TSV. A net timing algorithm may be useful to determine a signal propagation delay of a routed net that includes the TSV.

Operation 746 generally refers to swapping a (newly) assigned TSV with a previously assigned TSV, in response to a specification within an ECO. TSV swapping may occur in response to net timing constraints such as a specified maximum net delay, maximum net length or maximum rise/fall time of a signal on the net. TSV swapping may be useful in meeting net timing constraints of critical path nets and balancing the timing needs of critical and non-critical nets.

Operation 748 generally refers to adding (ECO) logic to couple a spare TSV to a net, in response to an ECO. ECO logic circuits (FIG. 4) may be useful in coupling a net within chip logic (FIG. 4) within a first chip of a 3-D IC to a TSV. Added ECO logic may be useful in providing driver, receiver and other logical and/or protocol functions to couple the spare TSV, from the list of spare TSVs, to the chip logic circuits.

Operation 750 generally refers to adding routing to couple a spare TSV to a net, in response to a specification within an ECO. Wiring may be added to a chip to connect the spare TSV from the list of spare TSVs to the ECO logic circuits of the chip. Added wiring may include both wires and vias in the BEOL layers.

Operation 752 generally refers to creating a spare TSV connected to a power distribution net, in response to an ECO. If an ECO is received after processing of interconnect layers below a capture layer (e.g., 578, FIG. 5), a spare TSV may be created that is connected to a power or ground distribution net.

Operation 754 generally refers to fabricating a TSV. In certain embodiments, a TSV may be fabricated in conjunction with both FEOL and BEOL chip processing steps. In certain embodiments, a TSV may be fabricated independent of FEOL and BEOL chip processing steps, depending on a chip/wafer processing technologies used.

Once a TSV reservation area is reused to add electrical interconnection to a 3-D IC, the process 700 may end at block 756.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 8:
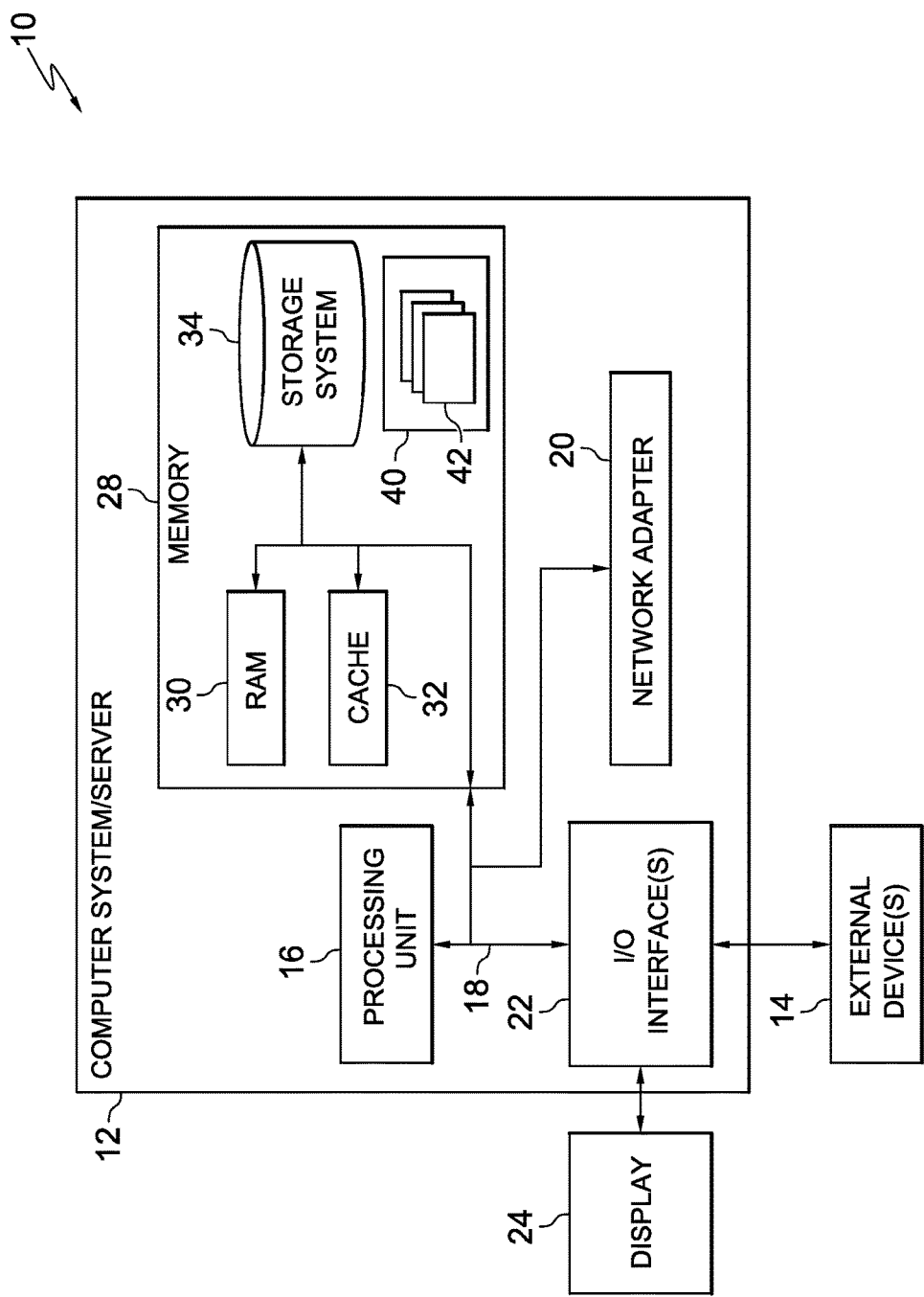
FIG. 8 depicts a cloud computing node, according to an embodiments of the present disclosure.

Referring now to FIG. 8, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 8, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 9:
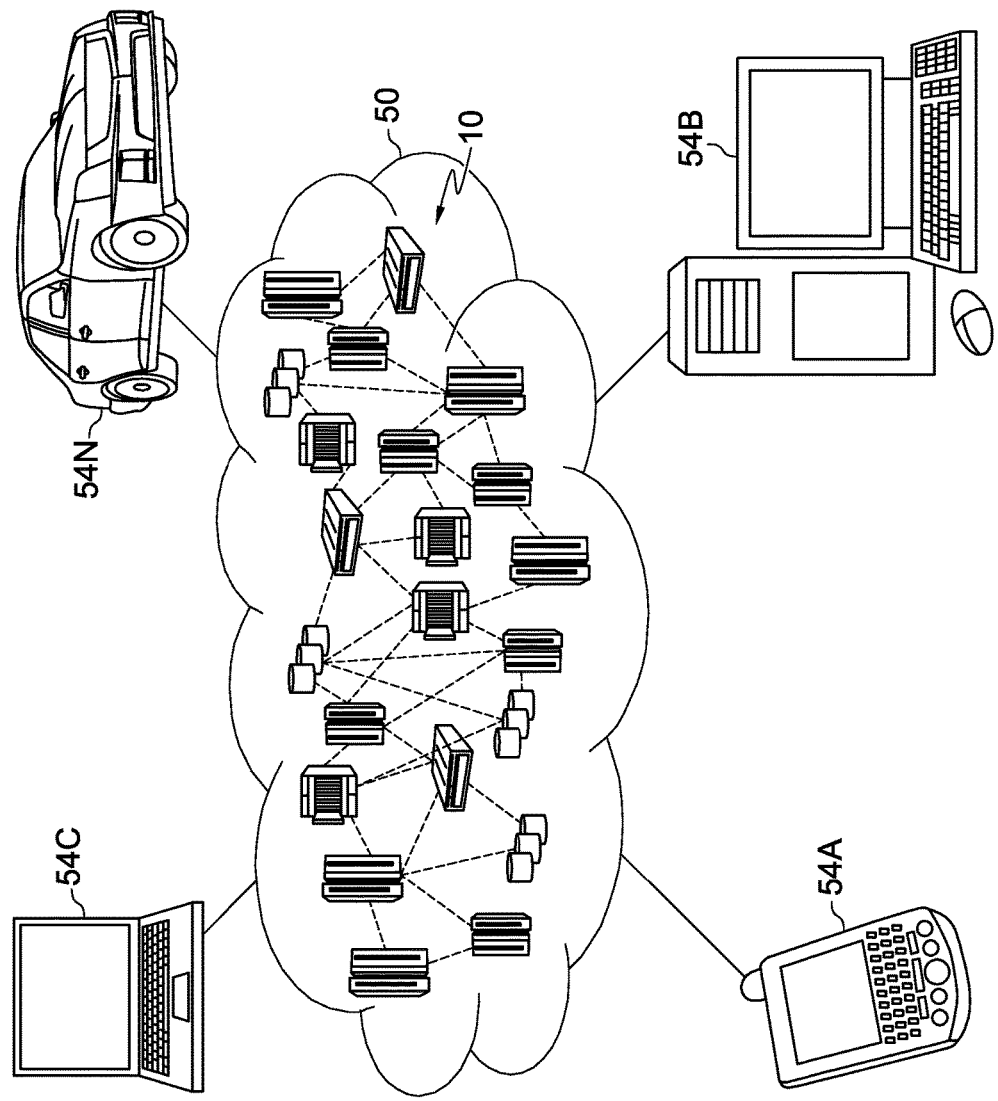
FIG. 9 depicts a cloud computing environment, according to embodiments of the present disclosure.

Referring now to FIG. 9, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 9 are intended to be illustrative only and that computing nodes 10 and cloud computing environment 50 can communicate with any type of computerized device over any type of network and/or network addressable connection (e.g., using a web browser).

Figure 10:
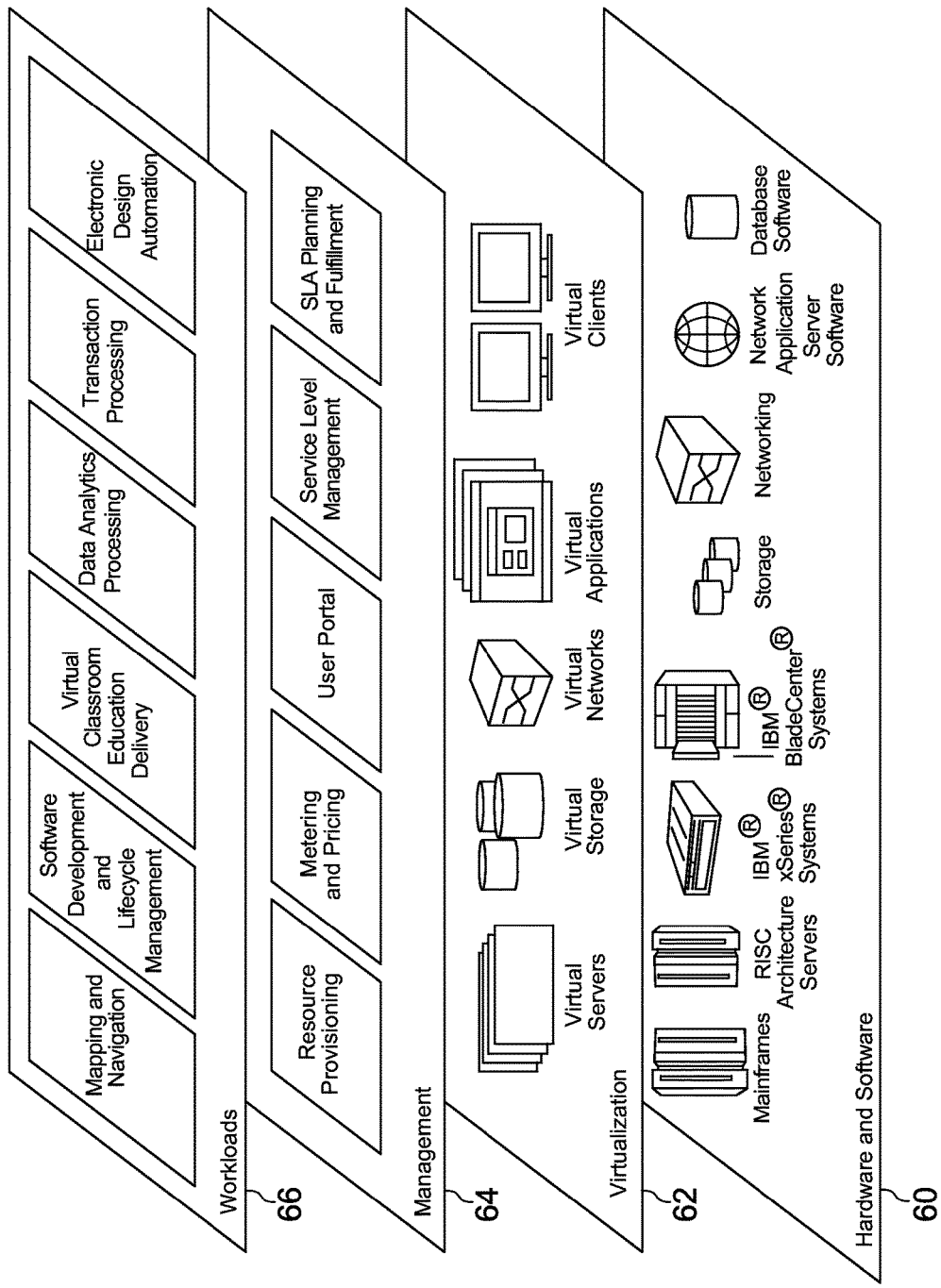
FIG. 10 depicts abstraction model layers, according to embodiments of the present disclosure.

Referring now to FIG. 10, a set of functional abstraction layers provided by cloud computing environment 50 (FIG. 8) is shown. It should be understood in advance that the components, layers, and functions shown in FIG. 10 are intended to be illustrative only and embodiments of the invention are not limited thereto. As depicted, the following layers and corresponding functions are provided:

Hardware and software layer 60 includes hardware and software components. Examples of hardware components include mainframes, in one example IBM zSeries® systems; RISC (Reduced Instruction Set Computer) architecture based servers, in one example IBM pSeries® systems; IBM xSeries® systems; IBM BladeCenter® systems; storage devices; networks and networking components. Examples of software components include network application server software, in one example IBM WebSphere® application server software; and database software, in one example IBM DB2® database software. (IBM, zSeries, pSeries, xSeries, BladeCenter, WebSphere, and DB2 are trademarks of International Business Machines Corporation registered in many jurisdictions worldwide).

Virtualization layer 62 provides an abstraction layer from which the following examples of virtual entities may be provided: virtual servers; virtual storage; virtual networks, including virtual private networks; virtual applications and operating systems; and virtual clients.

In one example, management layer 64 may provide the functions described below. Resource provisioning provides dynamic procurement of computing resources and other resources that are utilized to perform tasks within the cloud computing environment. Metering and Pricing provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal provides access to the cloud computing environment for consumers and system administrators. Service level management provides cloud computing resource allocation and management such that required service levels are met. Service Level Agreement (SLA) planning and fulfillment provide pre-arrangement for, and procurement of, cloud computing resources for which a future requirement is anticipated in accordance with an SLA.

Workloads layer 66 provides examples of functionality for which the cloud computing environment may be utilized. Examples of workloads and functions which may be provided from this layer include: mapping and navigation; software development and lifecycle management; virtual classroom education delivery; data analytics processing; transaction processing; and electronic design automation (EDA).

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A computer-implemented method for adding an electrical interconnection within a three-dimensional integrated circuit (3-D IC), the method comprising:
    creating, within a design file that specifies a layout of a first chip of the 3-D IC for storage in a non-transitory medium in communication with a computer system, design data corresponding to a set of through-silicon via (TSV) reservation areas;
    receiving at a computer system, an engineering change order (ECO);
    releasing, by the computer system, in response to the ECO, at least one TSV reservation area of the set of TSV reservation areas; and
    adding, in the at least one TSV reservation area created within the design file of the first chip of the 3-D IC, design data specifying at least one TSV element configured to create an electrical interconnection for connecting chips within the 3 D IC,
    wherein said adding said design data within the design file of the first chip of the 3-D IC to create an electrical interconnection within the 3-D IC further comprises:
        adding, at the computer system, in response to a specification within the ECO of at least one new TSV element connecting the first chip and a second chip of the 3-D IC, to a list of spare TSVs, design data corresponding to at least one of a spare TSV, a TSV reservation area, and a released TSV reservation area within the first chip; and
        assigning, to a net used to electrically interconnect the first chip and the second chip of the 3-D IC, a spare TSV from the list of spare TSVs; and
            wherein said assigning, to a net, a TSV from the list of spare TSVs further comprises at least one member of a group consisting of: determining, using a channel routing algorithm, a length of a routed net that includes the TSV, and determining, using a net timing algorithm, a signal propagation delay of a routed net that includes the TSV; and
        further comprises
            swapping, in response to net timing constraints within an ECO and to one of a length of a routed net and a signal propagation delay of a routed net, an assigned TSV with a previously assigned TSV.

2. The method of claim 1, wherein adding design data to the design file of the first chip to create an electrical interconnection within the 3-D IC further comprises adding, to the first chip, design data for ECO logic circuits that are electrically connected to chip logic circuits of the first chip and that are coupled the spare TSV from the list of spare TSVs.

3. The method of claim 2, wherein adding design data to the design file of the first chip to create an electrical interconnection for connecting chips within the 3-D IC further comprises adding logic for coupling, by routing wires on the first chip, the spare TSV from the list of spare TSVs to the ECO logic circuits of the first chip.

4. The method of claim 1, wherein assigning, to a net, a spare TSV from the list of spare TSVs further comprises adding logic for fabricating, in response to the spare TSV from the list of spare TSVs being located in a TSV reservation area, at least one TSV element in the TSV reservation area in the first chip of the 3-D IC.

* * * * *